(12) United States Patent
Lee

(10) Patent No.: US 9,151,917 B2
(45) Date of Patent: Oct. 6, 2015

(54) OPTICAL INTERCONNECTION APPARATUS AND METHOD

(71) Applicant: YTEL PHOTONICS INC., Gwanju-Si (KR)

(72) Inventor: Yong Tak Lee, Gwanju-Si (KR)

(73) Assignee: YTEL PHOTONICS INC., Gwangju-Si (KR)

( * ) Notice: Subject to any disclaimer, the term of this patent is extended or adjusted under 35 U.S.C. 154(b) by 0 days.

(21) Appl. No.: 13/941,425

(22) Filed: Jul. 12, 2013

(65) Prior Publication Data

US 2013/0301982 A1      Nov. 14, 2013

Related U.S. Application Data

(63) Continuation of application No. 13/121,409, filed as application No. PCT/KR2009/005552 on Sep. 29, 2009.

(30) Foreign Application Priority Data

Sep. 30, 2008    (KR) .................. 10-2008-0096319

(51) Int. Cl.
*G02B 6/12* (2006.01)
*G02B 6/42* (2006.01)
(Continued)

(52) U.S. Cl.
CPC .......... *G02B 6/4239* (2013.01); *G02B 6/12019* (2013.01); *G02B 6/2552* (2013.01); *G02B 6/262* (2013.01); *G02B 6/3644* (2013.01); *G02B 6/423* (2013.01); *G02B 6/4206* (2013.01);
(Continued)

(58) Field of Classification Search
CPC . G02B 6/3644; G02B 6/2552; G02B 6/12019
See application file for complete search history.

(56) References Cited

U.S. PATENT DOCUMENTS 4,812,002 A *   3/1989   Kato et al. ...................... 385/33
4,826,272 A *   5/1989   Pimpinella et al. ............. 385/92
(Continued)

FOREIGN PATENT DOCUMENTS

CN           1414409 A      4/2003
JP           9-73028 A      3/1997
(Continued)

OTHER PUBLICATIONS

International Search Report for PCT/KR2009/005552 dated May 12, 2010.
(Continued)

*Primary Examiner* — Charlie Y Peng
(74) *Attorney, Agent, or Firm* — Nixon Peabody LLP; Joseph Bach, Esq.

(57) ABSTRACT

The present invention relates to the apparatus and method for optical interconnection. The present invention provides an optical interconnection structure comprising: a substrate on which double side perforated multi-hole through a predetermined region is formed; bottom hole which is etched and tapered for optical fiber array is bigger than upper hole which is etched for the optical devices. The present invention provides the optical interconnection structure that can facilitate the optical interconnection between the active optoelectronic devices that transmit/receive the optical signals and the optical fiber array, making it possible to align easily and acutely between the optical devices and optical fiber array.

5 Claims, 5 Drawing Sheets

(51) Int. Cl.
 G02B 6/36 (2006.01)
 G02B 6/255 (2006.01)
 G02B 6/43 (2006.01)
 G02B 6/26 (2006.01)
 H05K 1/02 (2006.01)
 H05K 1/18 (2006.01)

(52) U.S. Cl.
 CPC ............... G02B 6/43 (2013.01); H05K 1/0274 (2013.01); *H05K 1/181* (2013.01); *H05K 2201/09072* (2013.01); *H05K 2201/09827* (2013.01); *H05K 2201/09845* (2013.01); *H05K 2201/10174* (2013.01); *H05K 2201/10674* (2013.01); *Y10T 29/49124* (2015.01)

(56) References Cited

U.S. PATENT DOCUMENTS

| | | | |
|---|---|---|---|
| 5,247,597 A * | 9/1993 | Blacha et al. | 385/88 |
| 5,345,529 A | 9/1994 | Sizer, II et al. | |
| 5,434,939 A * | 7/1995 | Matsuda | 385/88 |
| 6,493,121 B1 | 12/2002 | Althaus | |
| 6,915,049 B2 * | 7/2005 | Murata | 385/52 |
| 7,085,300 B2 * | 8/2006 | Werner et al. | 372/50.1 |
| 2002/0025122 A1 * | 2/2002 | Ouchi et al. | 385/88 |
| 2004/0037507 A1 * | 2/2004 | Marion et al. | 385/52 |
| 2004/0170353 A1 * | 9/2004 | Kobayashi et al. | 385/33 |
| 2006/0067607 A1 | 3/2006 | Fang et al. | |
| 2009/0147253 A1 * | 6/2009 | Hartmann et al. | 356/246 |

FOREIGN PATENT DOCUMENTS

| | | |
|---|---|---|
| KR | 10-2002-0041896 A | 6/2002 |
| KR | 10-0361501 B1 | 11/2002 |
| KR | 10-2003-0088249 A | 11/2003 |
| KR | 10-2008-0046047 A | 5/2008 |

OTHER PUBLICATIONS

Office Action in U.S. Appl. No. 13/121,409 dated Jan. 15, 2013.
Office Action in Chinese Patent Application No. 200980138533.3 dated Aug. 4, 2014.

* cited by examiner

OPTICAL INTERCONNECTION APPARATUS AND METHOD

CROSS-REFERENCE TO RELATED APPLICATIONS

This application is a Continuation-in-Part application of U.S. application Ser. No. 13/121,409, filed on Mar. 28, 2011, which is a National Phase of International Application No. PCT/KR2009/005552, which was filed on Sep. 29, 2009, and which claims priority to and the benefit of Korean Patent Application No. 10-2008-0096319, filed on Sep. 30, 2008, and the disclosures of which are hereby incorporated herein by reference in their entireties.

FIELD OF THE INVENTION

The present invention relates to the apparatus and method for optical interconnection, and more particularly, to an optical interconnection structure that double side perforated multi-hole through a predetermined region.

DESCRIPTION OF THE RELATED ART

Optical active cable generally used to send optical signal such as DVI (Digital Visual Interface). Optical interconnection apparatus used to fix between the optical fiber array and optical device.

This optical fiber apparatus is known for optical fiber connector. It connects optical fiber and optical device by the reticular shape body. For example, this optical interconnection apparatus is posted on 2008-46047 in Korea intellectual property office.

Optical fiber connector has two entrances; one is for the optical devices and the other is for the optical fiber. Therefore, optical devices and optical fiber is aligned by inserting into the optical connector.

Entrances for optical fiber holder and optical devices correspond to optical fiber and optical devices diameter. Therefore, optical devices and optical fiber holder are aligned by inserting into the optical connector.

However, problems arise in that if optical connector has some misalignment, there is nothing to compensate between the optical devices and optical fiber. In other words, due to optical devices and optical fiber are aligned by inserting into the optical fiber connector, if optical connector has some misalignment; there is nothing to compensate.

In addition, it is necessary additional optical connector to hold optical device and optical fiber.

SUMMARY OF THE INVENTION

The present invention provides the optical interconnection structure that can facilitate the optical interconnection between the active optoelectronic devices that transmit/receive the optical signals and the optical fiber array, making it possible to align easily and acutely between the optical devices and optical fiber array.

In order to solve the above problems, it is an object of the present invention to provide an optical interconnection structure that aligns between the optical devices and optical fiber array on the same axis easily by using perforated hole. Tapered hole make it possible to delicate control to the optical fiber array in an inserted state. Therefore, it can accurately align between the optical fiber core and optical devices.

It is another object of the present invention to provide an optical interconnection structure that can be manufactured in great quantities and remarkably improved in view of yield by allowing the semiconductor process at a wafer level to be performed during the processes for forming double side perforated hole on the substrate.

In order to accomplish the objects, according to a first aspect of the present invention, there is provided
an optical interconnection structure comprising: a substrate on which double side perforated multi-hole through a predetermined region is formed, the perforated multi-hole includes bottom hole which is etched and tapered for optical fiber array, in that the inner surface thereof is tilted and the entrance thereof is bigger than bottom surface, to make delicate control to the optical fiber array in an inserted state; and upper hole which is etched for the optical devices which are bonded on the substrate.

Preferably, the end point of the optical fiber array is located in n the boundary between bottom surface and the inner surface.

The substrate may be formed by a epoxy PCB, metal PCB, silicon PCB and glass PCB (printed circuit board) material and etched by deep trench RIE (reactive ion etcher system), electro chemical drill or femto-second laser process.

The optical interconnection structure preferably includes an optical fiber array; epoxy filled between the inner surface of the bottom hole and the optical fiber array 30; an optical device which is located to be aligned with the optical fiber array through the upper hole.

According to a second aspect of the present invention, there is provided a method for optical interconnection comprising: (a) forming the perforated multi-hole on double side of substrate in a predetermined region, the perforated multi-hole including bottom hole which is etched and tapered for optical fiber array, in that the inner surface thereof is tilted and the entrance thereof is bigger than bottom surface; (b) attaching an optical device on the substrate by flip chip bonding; (c) aligning an optical fiber array to the optical device through the perforated hole; (d) filling epoxy between the bottom hole and optical fiber array; and (e) exposing UV light.

Preferably, the substrate includes the electrical line pattern and the optical device is bonding by flip chip.

According to the present invention, there is provided an optical interconnection structure including: a substrate is made by metal, silicon and glass PCB (printed circuit board). Optical fiber array is aligned on the same axis by the perforated hole. Tapered hole can lead the optical fiber array to easily align. Optical devices such as laser diode and photodiode are attached by flip chip bonding on the substrate.

DETAILED DESCRIPTION OF THE PREFERRED EMBODIMENTS

Hereinafter, the embodiments of the present invention will be described in detail with reference to the accompanying drawings. However, the embodiments of the present invention may be modified in various shapes and the scope of the present invention is not limited to the embodiments set forth below. The embodiments of the present invention are provided for more completely explaining the present invention to those skilled in the art.

Figure 1:
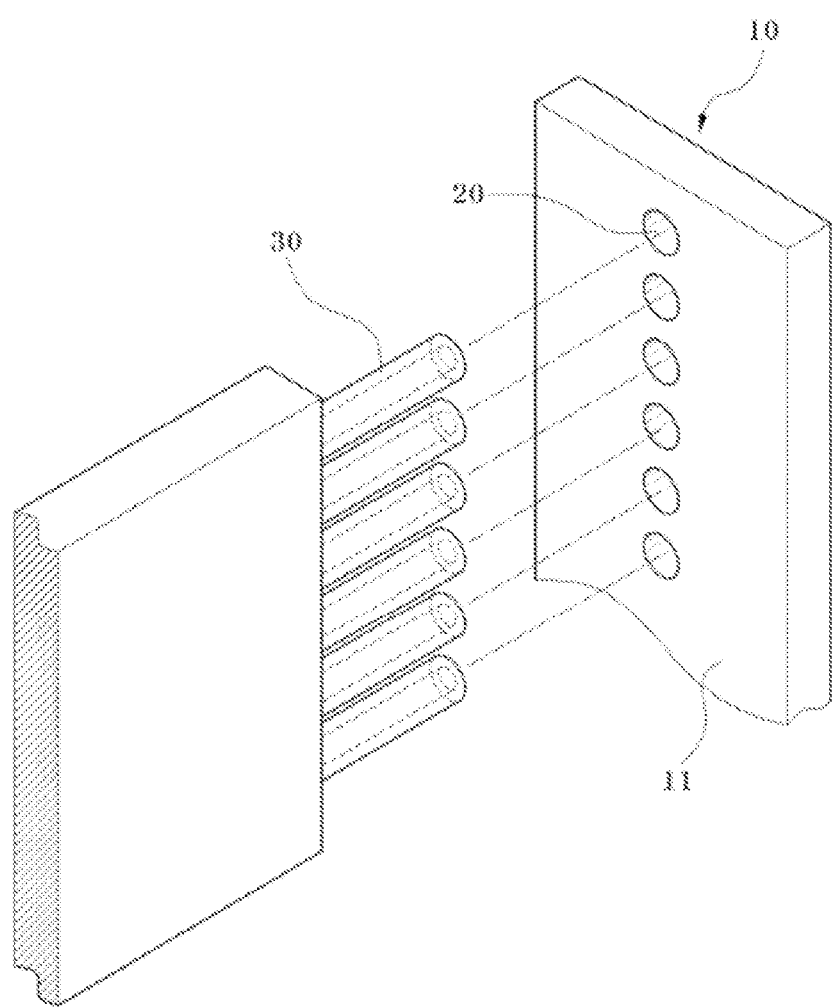
FIG. 1 explains an optical interconnection structure according to an embodiment of the present invention.
Figure 2A:
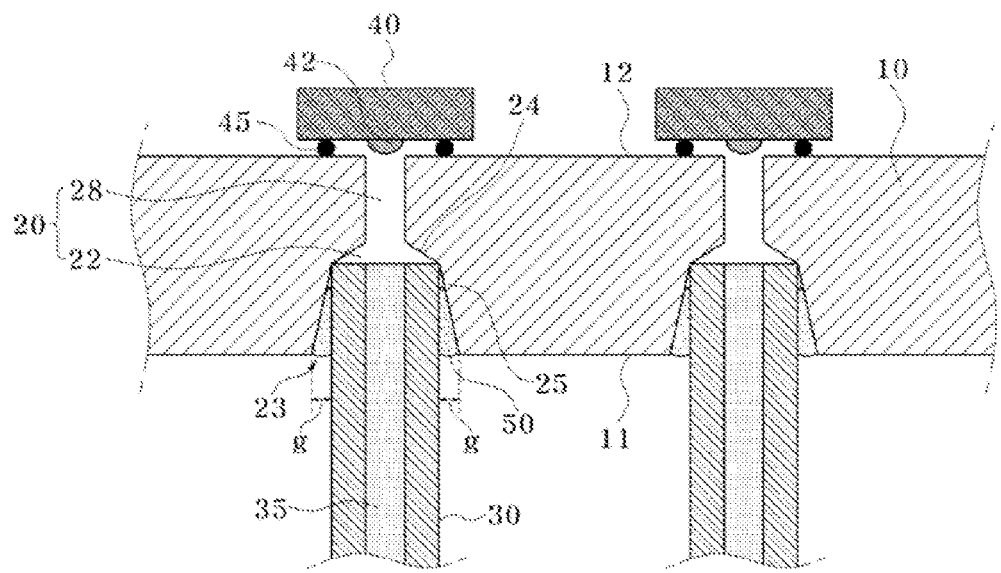
FIG. 2A is a cross-sectional view explaining an optical interconnection structure according to an embodiment of the present invention.
Figure 2B:
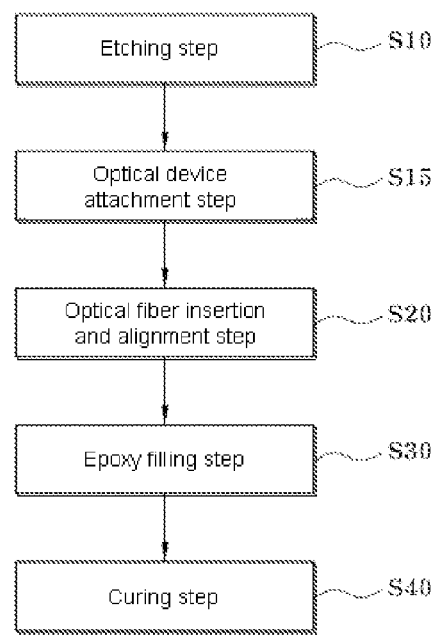
FIG. 2B explains a method for manufacturing an optical interconnection structure according to an embodiment of the present invention.

FIG. 1 explains an optical interconnection structure according to an embodiment of the present invention. FIG. 2 is a cross-sectional view explaining an optical interconnection structure according to an embodiment of the present invention.

The optical interconnection structure of FIG. 1 includes bottom hole 22 of optical fiber insertion, upper hole 28 of optical path and a substrate 10 on which multi-hole 20 perforating through a predetermined region is formed. Each optical fiber array 30 and each optical device 40 can be aligned through the perforated hole 20 of a substrate 10.

The substrate 10 preferably is formed by a metal, silicon or glass PCB (printed circuit board) material. According to the present invention, optical interconnection structure is formed by optical interconnection substrate 10 such as PCB. Therefore, optical devices 40 such as laser diode or photo diode can be packaged on the PCB substrate which is electrical patterned. Therefore, optical devices 40 can be easily connected with the optical interconnection structure which has electrical pattern. Therefore, additional process is not needed to connect with the optical interconnection structure.

A substrate 10 on which double side perforated multi-hole 20 through a predetermined region is formed. Each perforated multi-hole 20 include bottom hole 22 of optical fiber and upper hole 28 of optical path.

Bottom hole 22 is etched to allow the optical fiber to insert on the PCB substrate 10. Bottom hole 22 is etched about 200~300 µm by deep trench RIE (reactive ion etcher system), electro chemical drill or femto-second laser process. The bottom hole 22 has a tapered shape with cone shape. In the bottom hole 22, the inner surface 25 thereof is tilted and the entrance thereof is bigger than bottom surface 24. The inner surface 25 can lead the optical fiber array 30 to easily align. Due to the bottom hole 22 which is tapered for optical fiber array is bigger than the upper hole 28, it is possible to make delicate control to the optical fiber array 30 in an inserted state. Therefore, controlling the optical fiber array 30, it can accurately align between the optical fiber core 35 and optical devices 40. In the boundary between bottom surface 24 and the inner surface 25, the end point of the optical fiber array 30 is located. The entrance 23 of the bottom hole 22 is bigger than bottom surface 24. The bottom surface 24 and the inner surface 25 have taper shapes which is similar to cone shape. This is why it can accurately align between the optical fiber core 35 and optical devices 40.

There are about 20~100 µm gap (g) between the entrance 23 of the bottom hole 22 and optical fiber array 30.

To cope with the optical fiber core, the upper hole 28 size is smaller than the bottom hole 22 size.

Upper hole 28 provides the optical path which light pass though the optical fiber core and etched height is about 150 µm.

Perforated hole 20 on the PCB substrate 10 is fabricated by etching process. In the case of wiring pattern is designed on the PCB substrate 10, wiring pattern and perforated hole 20 can be formed by etching process. Therefore, perforated hole 20 can be made without additional micro fabrication.

The embodiments of the present invention includes optical fiber array 30 which is connected with perforated hole 20 on the substrate 10 and optical devices 40.

Optical fiber array 30 is aligned on the same axis by the perforated hole 20. The inner surface 25 can lead the optical fiber array 30 to easily align. Due to the bottom hole 22 which is tapered for optical fiber array is bigger than the upper hole 28, it is possible to make delicate control to the optical fiber array 30 in an inserted state. Therefore, controlling the optical fiber array 30, it can accurately align between the optical fiber core and optical devices.

Optical devices 40 are packaged on the PCB substrate 10. There are several methods to bond between optical devices 40 and the substrate 10 such as flip chip bonding or wire bonding. However, in the case of micro-lens 42 integrated optical devices 40 such as laser diode and photodiode, flip chip bonding is more preferred. The flip chip bonding height 45 is about 20 µm. Microlens is aligned by the optical path hole 28.

Optical fiber array 30 is fixed by inserting it into the bottom hole 22. The inner surface 25 can lead the optical fiber array 30 to easily align. Due to the bottom hole 22 which is tapered for optical fiber array is bigger than the upper hole 28, it is possible to make delicate control to the optical fiber array 30 in an inserted state. Therefore, controlling the optical fiber array 30, it can accurately align between the optical fiber core 35 and optical devices 40.

Epoxy 50 is filled between the inner surface 25 and optical fiber array 30 and then UV light is exposed to cure. Therefore, optical fiber array 30 is fixed on the substrate 10.

Figure 3:
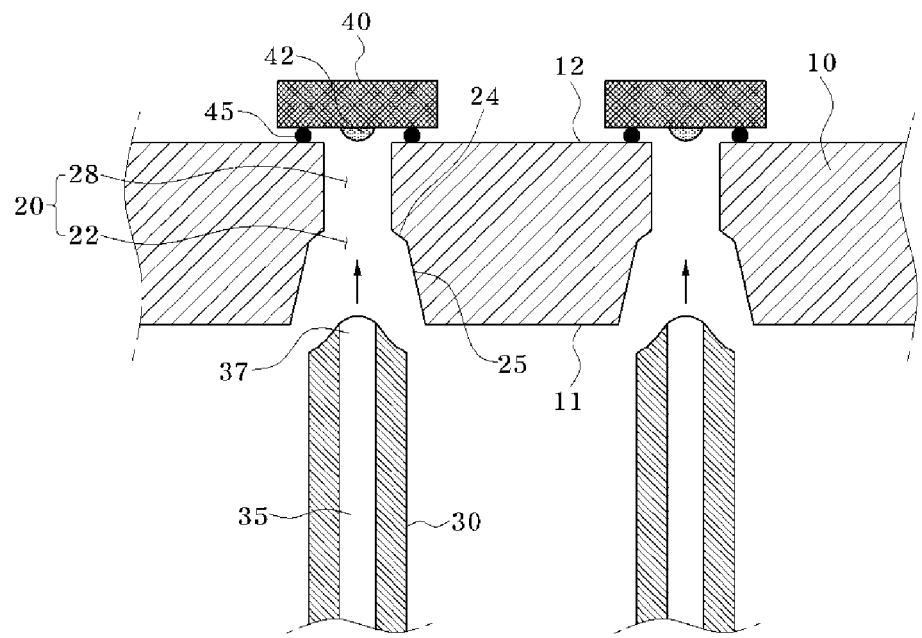
FIG. 3 and FIG. 4 are cross-sectional views explaining an optical interconnection structure according to another embodiment of the present invention.

FIG. 3 explains a method for manufacturing an optical interconnection structure according to an embodiment of the present invention. The substrate 10 preferably is formed by a metal, silicon or glass PCB (printed circuit board) material.

A substrate 10 on which double side perforated multi-hole through a predetermined region is formed (S10).

Perforated hole 20 consists of bottom hole 22 for optical fiber array insertion and upper hole 28 for optical path. Perforated hole 20 is formed by etching process, and the bottom hole 22 is tapered.

Etching process S10 includes the optical interconnection surface 12, if necessary, wiring pattern can be formed other surface. These kinds of wiring pattern can be used for electrical connection between optical devices 40 or between optical interconnection substrate 10.

Alignment step S20, optical fiber array 30 is aligned on the same axis by inserting into the perforated hole. Epoxy 50 is filled S30 between the inner surface 25 and optical fiber array 30 and UV light is exposed S40 to cure.

Epoxy 50 can be substituted of other materials which have the similar characteristics. These kinds of materials are treated the same as epoxy.

The embodiments of the present invention include optical devices 40 attachment S15 on the substrate 10. Before or after the optical fiber array insertion, optical devices attachment can be done. Desirable, optical devices are attached before the optical fiber array insertion.

Figure 4:
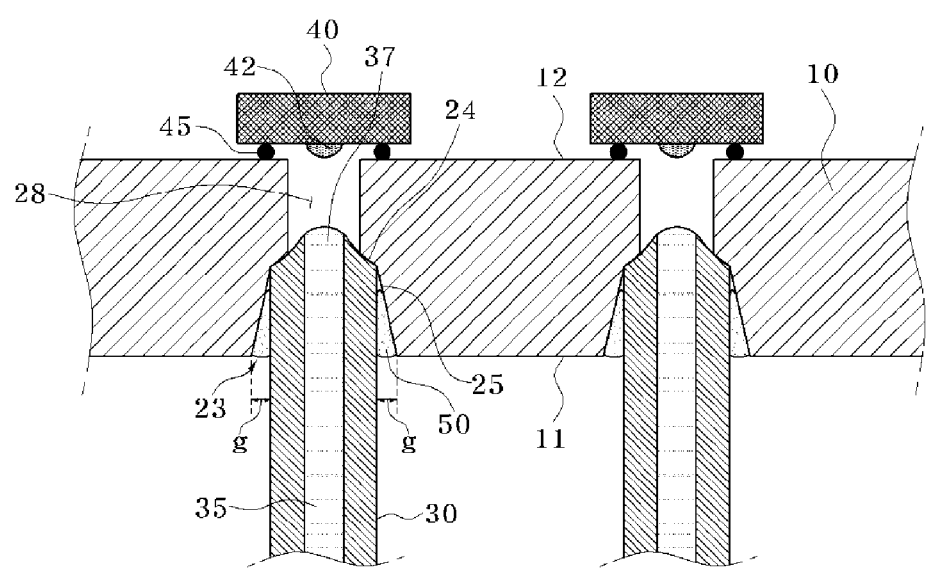

FIG. 3 and FIG. 4 are cross-sectional views explaining an optical interconnection structure according to another embodiment of the present invention. It will be explained in detail based on the difference between structure of FIG. 1 and FIG. 3 in order to avoid repetition of explanation.

Referring to FIG. 3 and FIG. 4, the ends of optical fiber array 30 have lens shape 37 which is different from structure of FIG. 1. The lens shape 37 could be formed by melting the end of the optical fiber 30 with melting means such as torch or laser and pulling outward the end of the optical fiber 30, simultaneously with melting. The lens shape 37 can lead the optical fiber array 30 to easily align with perforated hole 20. Additionally, the lens shape 37 could collect beams effectively because of the lens characteristic. Referring to 4, the lens shape 37 could be tightly attachable to the bottom surface 24 of the bottom hole 22.

Figure 5:
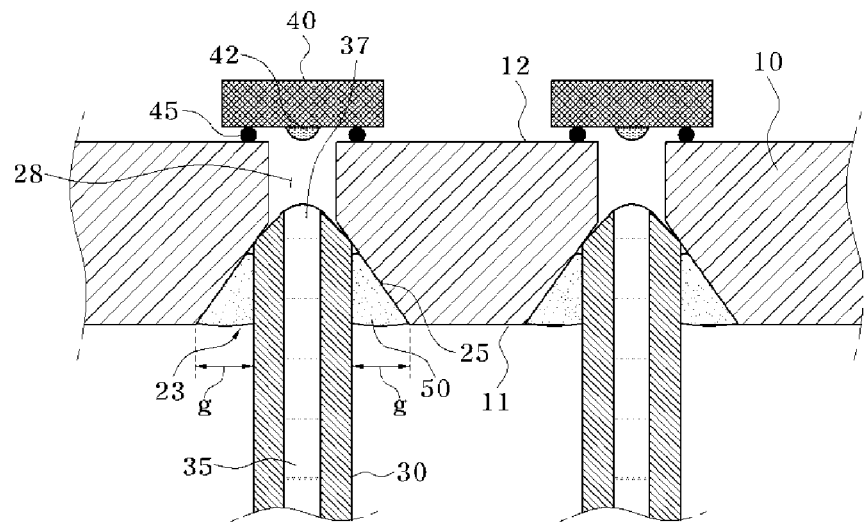
FIG. 5 is a cross-sectional view explaining an optical interconnection structure according to another embodiment of the present invention.

FIG. 5 is a cross-sectional view explaining an optical interconnection structure according to another embodiment of the present invention.

Referring to 5, the lens shape 37 could be tightly attachable to the inner surface 25 of the bottom hole 22. In FIG. 5, unlike FIG. 4, there is no the bottom surface 24. Therefore, this structure is simpler than FIG. 4.

Figure 6:
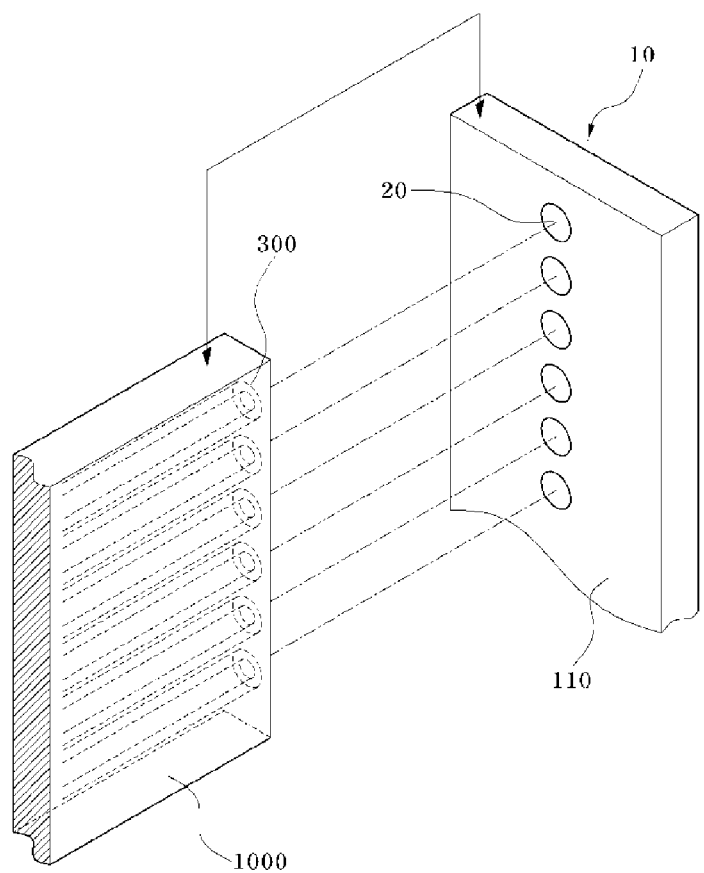
FIG. 6 explains an optical interconnection structure according to another embodiment of the present invention.
Figure 7:
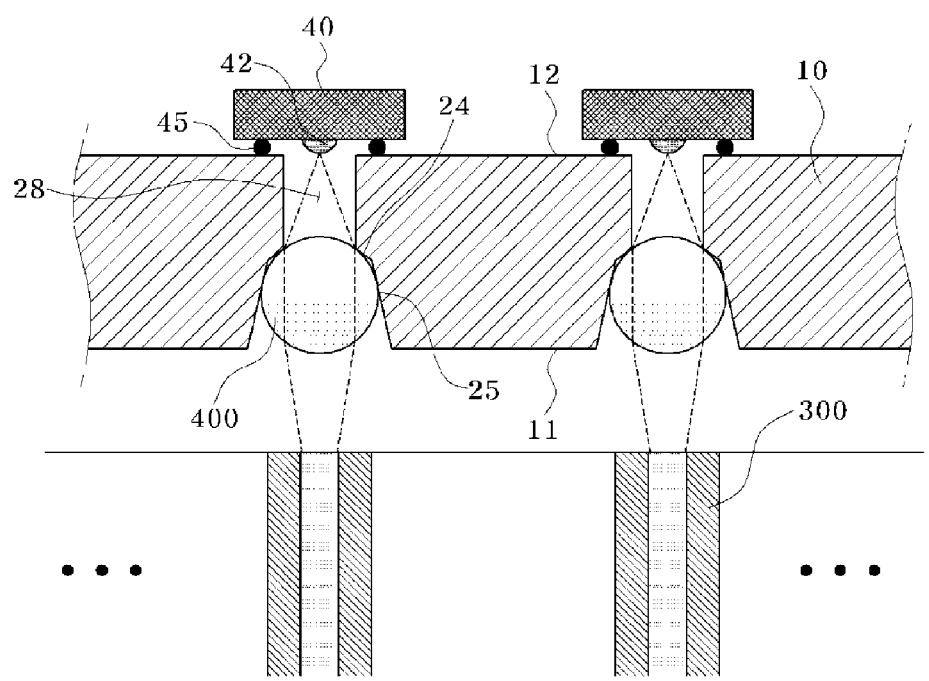
FIG. 7 is a cross-sectional view explaining an optical interconnection structure according to another embodiment of FIG. 6.

FIG. 6 explains an optical interconnection structure according to another embodiment of the present invention. FIG. 7 is a cross-sectional view explaining an optical interconnection structure according to another embodiment of FIG. 6.

The optical interconnection structure of FIG. 6 includes a substrate 110 on which multi-holes 20 perforating through a predetermined region are formed. Each optical fiber array 300 can be aligned through the perforated hole 20 of a substrate 110. Each ball lens 400 is inserted in multi-holes 20. The substrate 110 is fixed in the optical fiber assembly 1000 with other fixing means (not shown). In preferred embodiment, the substrate 110 is fixed in the optical fiber assembly 1000 after the alignment of optical fiber and ball lens 400.

In one embodiment, the inner surface 25 and the bottom surface 24 are formed with different tilt angle. But, one surface, shown in FIG. 5 is also applicable to the structure of FIG. 6.

The ball lens 400 can be made of glass or plastic material. The ball lens 400 can be fixed in the perforated hole 20 with various methods. In case the ball lens 400 is made of glass and the substrate 110 is made of silicon, after the ball lens is put into the perforated hole 20, the ball lens and the perforated hole 20 can be annealed, for example, within furnace. The annealing process causes the contact portion of the ball lens 400 and the substrate 110 to have silicon oxide material. The silicon oxide material can make the ball lens 400 and the substrate 110 to be attached without any other fixing process such as glue, epoxy, and so on.

What is claimed is:

1. An optical interconnection structure comprising:
   a substrate having both sides, a plurality of perforated holes being formed through the substrate, optical devices being bonded to one side of the substrate, optical fibers being connected to the other side of the substrate,
   wherein each of the plurality of perforated holes includes a upper hole portion and a bottom hole portion and each optical device is placed on the upper hole portion, and each optical fiber is attached to the bottom hole portion,
   and wherein the bottom hole portion has tapered shape and the end of each optical fiber has a lens shape, the lens shape being formed by melting the end of the optical fiber and pulling outward the end of the optical fiber simultaneously with melting,
   wherein the bottom hole portion further includes a bottom surface of tapered shape with a different angle in the boundary between the upper hole portion and the bottom hole portion.

2. The optical interconnection structure according to claim 1, wherein the end point of each optical fiber is located in the boundary between the upper hole portion and the bottom hole portion, when the optical fibers are connected to the other side of the substrate.

3. The optical interconnection structure according to claim 1, wherein the substrate is an epoxy PCB, metal PCB, silicon PCB, or glass PCB (printed circuit board) material.

4. The optical interconnection structure according to claim 1, wherein an epoxy is filled between the each optical fiber and the an bottom hole portion.

5. The optical interconnection structure according to claim 1, wherein the optical devices are laser diodes or photodiodes.

* * * * *